US012575450B2

(12) United States Patent
Hashimoto

(10) Patent No.: US 12,575,450 B2
(45) Date of Patent: Mar. 10, 2026

(54) LIGHT-EMITTING DEVICE

(71) Applicant: NICHIA CORPORATION, Anan (JP)

(72) Inventor: Takuya Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 707 days.

(21) Appl. No.: 17/944,077

(22) Filed: Sep. 13, 2022

(65) Prior Publication Data

US 2023/0079915 A1 Mar. 16, 2023

(30) Foreign Application Priority Data

Sep. 14, 2021 (JP) ................................. 2021-149045
May 12, 2022 (JP) ................................. 2022-078533

(51) Int. Cl.
| | |
|---|---|
| *H01L 25/075* | (2006.01) |
| *H01L 23/34* | (2006.01) |
| *H10H 20/85* | (2025.01) |
| *H10H 20/857* | (2025.01) |

(52) U.S. Cl.
CPC .......... *H01L 25/0753* (2013.01); *H01L 23/34* (2013.01); *H10H 20/8506* (2025.01); *H10H 20/857* (2025.01)

(58) Field of Classification Search
CPC ... H01L 25/0753; H01L 23/34; H01L 25/167; H10H 20/8506; H10H 20/857
See application file for complete search history.

(56) References Cited

U.S. PATENT DOCUMENTS

| | | | | |
|---|---|---|---|---|
| 10,374,196 | B2 * | 8/2019 | Racz ...................... | H10K 71/00 |
| 11,961,872 | B2 * | 4/2024 | Cha ..................... | H01L 25/0753 |
| 2009/0129420 | A1 | 5/2009 | Regaard et al. | |
| 2013/0001599 | A1 * | 1/2013 | Lee ..................... | H10H 20/857 |
| | | | | 257/E27.12 |
| 2015/0348949 | A1 | 12/2015 | Kobayakawa | |
| 2018/0182931 | A1 * | 6/2018 | Lee ..................... | H10H 20/851 |
| 2020/0041086 | A1 * | 2/2020 | Mertens ............. | H01R 13/7175 |
| 2020/0118982 | A1 * | 4/2020 | Ukawa ............... | H10H 20/8513 |
| 2022/0342140 | A1 * | 10/2022 | Itakura ............... | H01S 5/02208 |
| 2024/0136470 | A1 * | 4/2024 | Kawaguchi ........... | H01S 5/0287 |

FOREIGN PATENT DOCUMENTS

| | | |
|---|---|---|
| JP | 2009-170881 A | 7/2009 |
| JP | 2015-225917 A | 12/2015 |
| JP | 2018-207125 A | 12/2018 |

* cited by examiner

*Primary Examiner* — Eliseo Ramos Feliciano
*Assistant Examiner* — Thaddeus J Kolb
(74) *Attorney, Agent, or Firm* — Spencer Fane LLP

(57) ABSTRACT

A light-emitting device includes a mounting member, first to third light-emitting elements mounted on a mounting surface, and first to third protective elements mounted on the mounting surface and respectively electrically connected to the first to third light-emitting elements. In a plan view viewed along a normal direction of the mounting surface, at least a part of the first protective element is disposed between the first light-emitting element and the second light-emitting element, at least a part of the second protective element and at least a part of the third protective element are disposed between the second light-emitting element and the third light-emitting element, and the second light-emitting element is disposed between the first light-emitting element and the third light-emitting element.

15 Claims, 7 Drawing Sheets

LIGHT-EMITTING DEVICE

CROSS-REFERENCE TO RELATED APPLICATION

This application claims priority to Japanese Patent Application No. 2021-149045, filed on Sep. 14, 2021, and Japanese Patent Application No. 2022-78533 filed on May 12, 2022, the disclosures of which are hereby incorporated herein by reference in their entireties.

BACKGROUND

The present invention relates to a light-emitting device.

Japanese Patent Publication No. 2018-207125 discloses a light-emitting element package including a protective element that individually protects a plurality of light-emitting elements.

SUMMARY

One object of the present disclosure is to provide a small light-emitting device.

A light-emitting device disclosed in an embodiment includes a mounting member, a first light-emitting element, a second light-emitting element, a third light-emitting element, a first protective element, a second protective element and a third protective element. The mounting member has a mounting surface. The first light-emitting element is disposed on the mounting surface. The second light-emitting element is disposed on the mounting surface. The third light-emitting element is disposed on the mounting surface. The first protective element is disposed on the mounting surface and electrically connected to the first light-emitting element. The second protective element is disposed on the mounting surface and electrically connected to the second light-emitting element. The third protective element is disposed on the mounting surface and electrically connected to the third light-emitting element. In a plan view viewed along a normal direction of the mounting surface, at least a part of the first protective element is disposed between the first light-emitting element and the second light-emitting element, at least a part of the second protective element and at least a part of the third protective element are disposed between the second light-emitting element and the third light-emitting element, and the second light-emitting element is disposed between the first light-emitting element and the third light-emitting element.

In at least one or more inventions disclosed in embodiments, an effect of reducing a size of a light-emitting device is expected.

DETAILED DESCRIPTION

Figure 1:
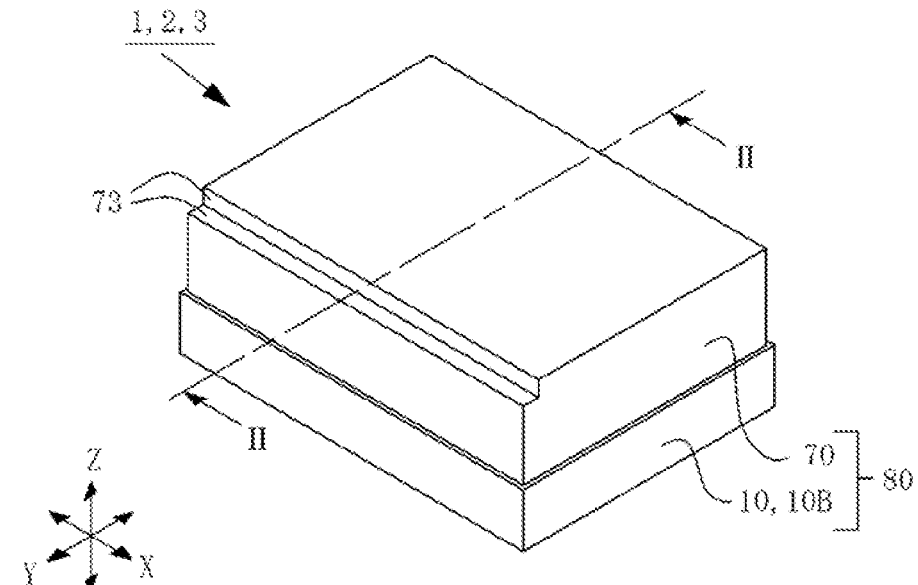
FIG. 1 is a schematic perspective view of a light-emitting device according to a first embodiment, a second embodiment, and a third embodiment.

In this specification or the scope of the claims, polygons such as triangles and quadrangles, including shapes in which the corners of the polygon are rounded, chamfered, beveled, coved, or the like, are referred to as polygons. Furthermore, a shape obtained by processing not only the corners (ends of sides), but also an intermediate portion of a side is similarly referred to as a polygon. That is, a shape that is partially processed while remaining a polygon shape as a base is included in the interpretation of "polygon" described in this specification and the scope of the claims.

The same applies not only to polygons but also to words representing specific shapes such as trapezoids, circles, protrusions, and recessions. Furthermore, the same applies when dealing with each side forming that shape. That is, even if processing is performed on a corner or an intermediate portion of a certain side, the interpretation of "side" includes the processed portion. Note that when a "polygon" or "side" not partially processed is to be distinguished from a processed shape, "exact" will be added to the description as in, for example, "an exact quadrangle".

Furthermore, in this specification or the scope of the claims, descriptions such as upper and lower, left and right, top and bottom, front and back, near and far, and the like are used merely to describe a relative relationship of positions, orientations, directions, and the like, and the expressions need not necessarily match an actual relationship at a time of use.

In the drawings, directions such as an X direction, a Y direction, and a Z direction may be indicated by using arrows. Directions of the arrows match between the plurality of drawings according to the same embodiment.

Further, "member" and "portion" may be used when, for example, a component and the like are described in this specification. The term "member" refers to an object physically treated alone. The object physically treated alone can be an object treated as one part in a manufacturing step. On the other hand, the term "portion" refers to an object that may not be physically treated alone. For example, the term "portion" is used when a part of one member is partially regarded.

Note that a distinction in writing between "member" and "portion" described above does not indicate the intention of consciously limiting the scope of the right in the interpretation of doctrine of equivalents. In other words, even when there is a component described as "member" in the scope of the claims, it does not mean that the applicant recognizes that physically treating the component alone is essential for the application of the present invention.

Furthermore, in this specification or the scope of the claims, when there are a plurality of components and each of the components is to be expressed separately, the components may be distinguished by adding the terms "first" and "second" at the beginning of the component term. Further, objects to be distinguished may differ between this specification and the scope of the claims. Thus, even when a component provided with the same term as that in this specification is described in the scope of the claims, an object identified by the component may not be the same in this specification and the scope of the claims.

For example, when there are components distinguished by being termed "first", "second", and "third" in this specification, and when the components provided with the terms "first" and "third" in this specification are described in the scope of the claims, the components may be distinguished by being termed "first" and "second" in the scope of the claims from a perspective of ease of understanding. In this case, the components termed "first" and "second" in the scope of the claims refer to the components termed "first" and "third" in this specification, respectively. Note that an object applied for this rule is not limited to a component, and the rule also applies to another object in a reasonable and flexible manner.

Embodiments for implementing the present invention will be described below. Furthermore, specific embodiments for implementing the present invention will be described below with reference to the drawings. Note that embodiments for implementing the present invention are not limited to the specific embodiments. In other words, the illustrated embodiments do not disclose only one form in which the present invention is realized, and disclose an exemplary form. Note that sizes, positional relationships, and the like of members illustrated in the drawings may sometimes be exaggerated in order to facilitate understanding.

First Embodiment

Figure 2:
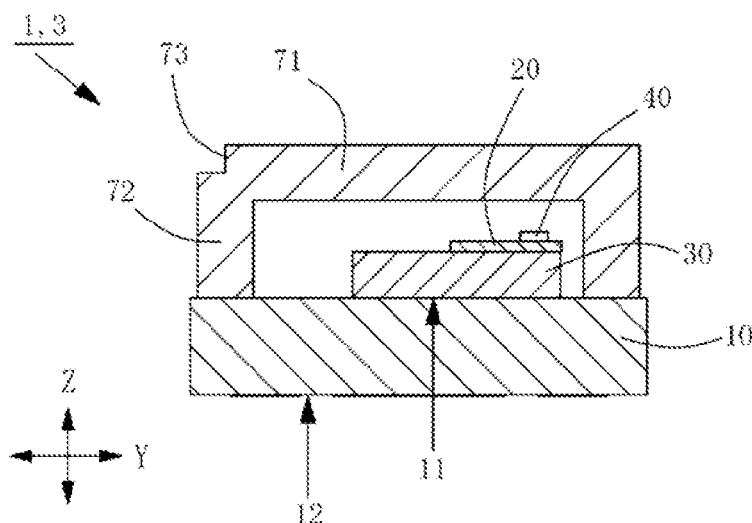
FIG. 2 is a schematic cross-sectional view of the light-emitting device according to the first embodiment and the third embodiment taken along a line II-II in FIG. 1.
Figure 3:
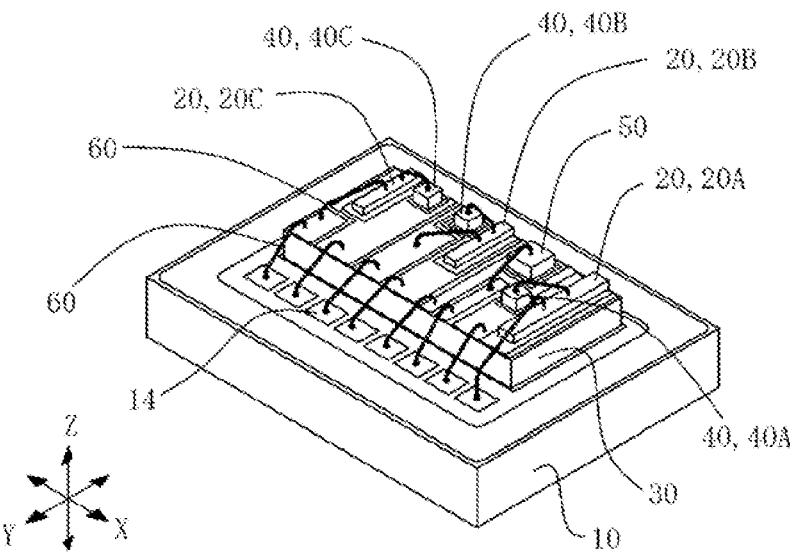
FIG. 3 is a perspective view of the light-emitting device according to the first embodiment before a cap is mounted.
Figure 4:
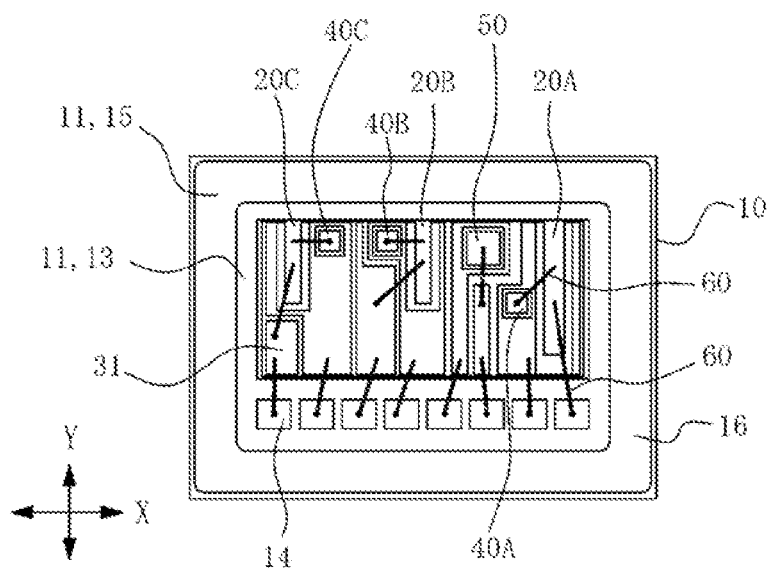
FIG. 4 is a top view of the light-emitting device according to the first embodiment before the cap is mounted.
Figure 5:
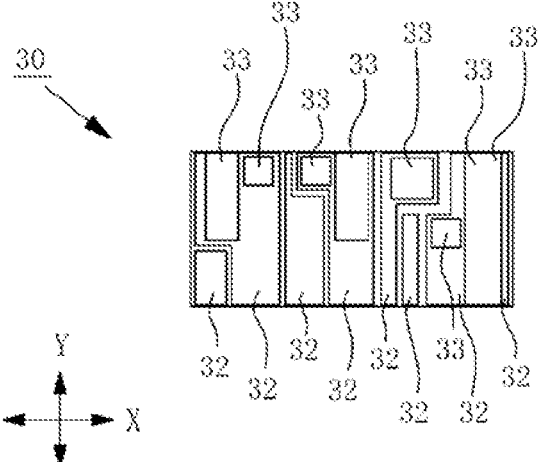
FIG. 5 is a schematic top view of a submount according to the first embodiment.
Figure 6:
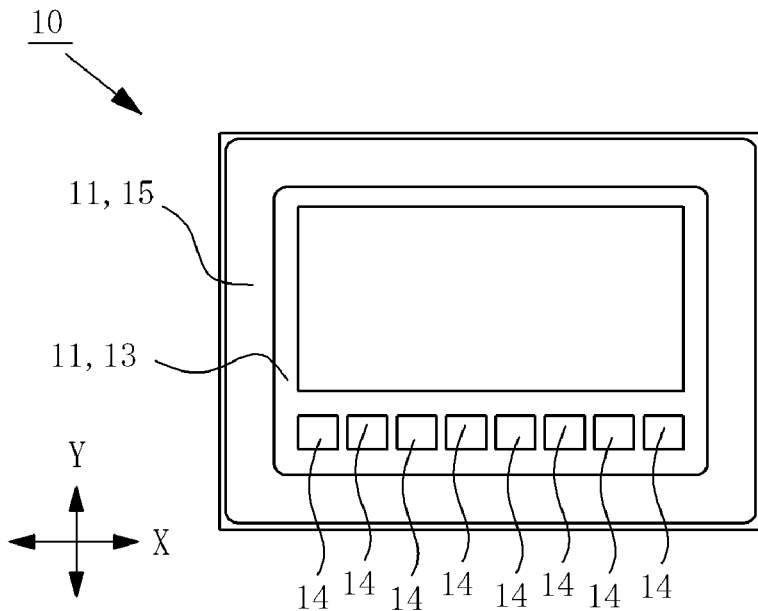
FIG. 6 is a schematic top view of a substrate according to the first embodiment and the third embodiment.
Figure 7:
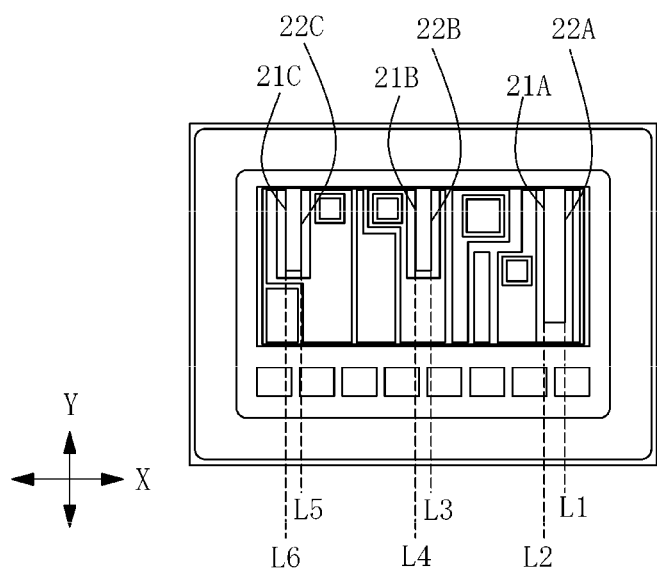
FIG. 7 is a schematic diagram illustrating imaginary lines L1 to L6 for explaining the light-emitting device according to the first embodiment.
Figure 8:
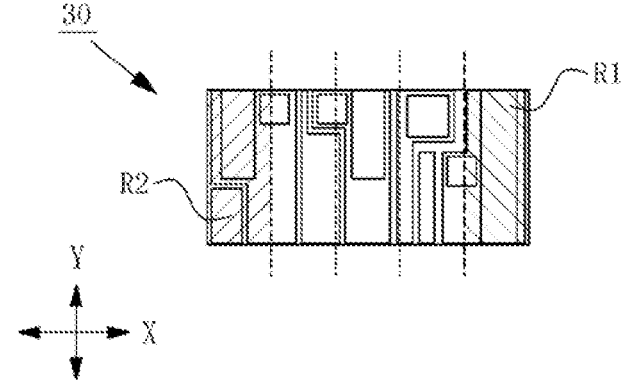
FIG. 8 is a schematic diagram illustrating hatched regions R1 and R2 for explaining the light-emitting device according to the first embodiment.

A light-emitting device 1 according to a first embodiment will be described. FIGS. 1 to 8 are drawings for explaining the light-emitting device 1. FIG. 1 is a schematic perspective view of the light-emitting device 1. FIG. 2 is a schematic cross-sectional view of the light-emitting device 1 taken along a line II-II in FIG. 1. FIG. 3 is a perspective view of the light-emitting device 1 before a cap 70 is mounted. FIG. 4 is a top view corresponding to FIG. 3. FIG. 5 is a schematic top view of a submount 30. FIG. 6 is a schematic top view of a substrate 10. FIG. 7 is a schematic diagram illustrating imaginary lines L1 to L6 described below. FIG. 8 is a schematic diagram illustrating hatched regions R1 and R2 described below.

The light-emitting device 1 includes a plurality of components. The plurality of components include the substrate 10, one or a plurality of light-emitting elements 20, the submount 30, one or a plurality of protective elements 40, a temperature measuring element 50, a wiring line 60, and the cap 70. Note that the light-emitting device 1 may include a component other than the components described above. The light-emitting device 1 may not include some of the plurality of components described above. First, each of the components will be described.

Substrate 10

The substrate 10 includes an upper surface 11, a lower surface 12, and one or a plurality of outer surfaces. The substrate 10 has a plate shape. The shape of the substrate 10 is a rectangular parallelepiped. Note that the shape of the substrate 10 may not be a plate shape or may not be a rectangular parallelepiped. In a top view, an outer edge shape of the substrate 10 is rectangular. The rectangular shape can be a rectangular shape having long sides and short sides. In the substrate 10 illustrated in the drawings, a long side direction of the rectangle is the same direction as the X direction, and a short side direction is the same direction as the Y direction. Note that the outer edge shape of the substrate 10 in the top view may not be a rectangular shape.

The substrate 10 includes a first mounting region 13 and a second mounting region 15 on the upper surface 11 side. In the top view, the first mounting region 13 is surrounded by the second mounting region 15. The first mounting region 13 is provided on the upper surface 11. The second mounting region 15 is provided on the upper surface 11.

One or a plurality of wiring patterns 14 are provided in the first mounting region 13. The wiring pattern 14 is electrically connected to a wiring pattern provided on the lower surface 12 of the substrate 10 via a wiring passing through the interior of the substrate 10. Note that the wiring pattern may be connected from the upper surface 11 to the lower surface 12 via the outer surface instead of passing through the interior.

The substrate 10 can be provided with the plurality of wiring patterns 14. The plurality of wiring patterns 14 are disposed side by side in one direction on the upper surface 11 of the substrate 10. In the substrate 10 illustrated in the drawings, the plurality of wiring patterns 14 are disposed side by side in the X direction.

A metal film 16 for bonding is provided in the second mounting region 15. The metal film 16 surrounds the first mounting region 13. Note that the wiring pattern electrically connected to the wiring pattern 14 may be provided on a surface other than the lower surface 12 of the substrate 10. For example, the upper surface 11 of the substrate 10 may be expanded to the outside of the second mounting region 15, and the wiring pattern may be provided outside the second mounting region 15.

The substrate 10 can be formed using ceramic as a main material. Examples of the ceramic include aluminum nitride, silicon nitride, aluminum oxide, silicon carbide, and the like. Note that the substrate 10 may be formed of a material other than the ceramic.

Here, the main material refers to a material that occupies the greatest ratio of a formed product being an object in terms of weight or volume. Note that, when a formed product being an object is formed of one material, the material is the main material. In other words, when a certain material is the main material, a ratio of the material may be 100%.

Light-Emitting Element 20

The light-emitting element 20 includes a light-emitting surface that emits light. The light-emitting element 20 includes an upper surface, a lower surface, and a plurality of lateral surfaces. The lateral surface of the light-emitting element 20 can serve as the light-emitting surface. Note that the other surface may serve as the light-emitting surface. Further, a plurality of surfaces may serve as the light-emitting surface.

A semiconductor laser element can be employed as the light-emitting element 20. Note that the light-emitting element 20 is not limited to a semiconductor laser element, and a light-emitting diode or the like may be employed.

As the light-emitting element 20, for example, a light-emitting element that emits blue light, a light-emitting element that emits green light, or a light-emitting element that emits red light can be employed. Note that a light-emitting element that emits light of another color or light having an emission peak wavelength may be employed as the light-emitting element 20. For example, a light-emitting element that emits infrared light may be employed as the light-emitting element 20.

Blue light refers to light having an emission peak wavelength within a range from 420 nm to 494 nm. Green light refers to light having the emission peak wavelength within a range from 495 nm to 570 nm. Red light refers to light having the emission peak wavelength within a range from 605 nm to 750 nm.

Here, a semiconductor laser element being an example of the light-emitting element 20 will be described. The semiconductor laser element has a rectangular outer shape having one set of opposite sides as long sides and another set of opposite sides as short sides in the top view. Light (laser light) emitted from the semiconductor laser element spreads. Further, divergent light is emitted from an emission end surface of the semiconductor laser element. The emission end surface of the semiconductor laser element can be referred to as the light-emitting surface of the light-emitting element 20.

The light emitted from the semiconductor laser element forms afar field pattern (hereinafter referred to as an "FFP") of an elliptical shape in a plane parallel to the emission end surface of the light. The FFP indicates a shape and a light intensity distribution of the emitted light at a position separated from the emission end surface.

Here, light passing through the center of the elliptical shape of the FFP, in other words, light having a peak intensity in the light intensity distribution of the FFP, is referred to as light traveling on an optical axis or light passing through an optical axis. Based on the light intensity distribution of the FFP, light having an intensity of $1/e^2$ or more with respect to a peak intensity value is referred to as a main portion of the light.

The shape of the FFP of the light emitted from the semiconductor laser element is an elliptical shape in which the light in a layering direction is longer than in a direction perpendicular to the layering direction in the plane parallel to the emission end surface of the light. The layering direction is a direction in which a plurality of semiconductor layers including an active layer are layered in the semiconductor laser element. The direction perpendicular to the layering direction can also be referred to as a plane direction of the semiconductor layer. Further, a long diameter direction of the elliptical shape of the FFP can also be referred to as a fast axis direction of the semiconductor laser element, and a short diameter direction can also be referred to as a slow axis direction of the semiconductor laser element.

Based on the light intensity distribution of the FFP, an angle at which light having a light intensity of $1/e^2$ of a peak light intensity spreads is referred to as a spread angle of light of the semiconductor laser element. For example, the spread angle of light can also be determined based on the light intensity that is half of the peak light intensity in addition to being determined based on the light intensity of $1/e^2$ of the peak light intensity. In the description in this specification, the "spread angle of light" being simply referred refers to a spread angle of light at the light intensity of $1/e^2$ of the peak light intensity. Note that it can be said that the spread angle in the fast axis direction is greater than the spread angle in the slow axis direction.

Examples of the semiconductor laser element that emits blue light or the semiconductor laser element that emits green light include a semiconductor laser element including a nitride semiconductor. GaN, InGaN, and AlGaN, for example, can be used as the nitride semiconductor. Examples of the semiconductor laser element that emits red light include a semiconductor laser element including an InAlGaP-based, GaInP-based, GaAs-based, or AlGaAs-based semiconductor.

Submount 30

The submount 30 includes a mounting surface 31. An upper surface of the submount 30 may serve as the mounting surface 31. Other component(s) is mounted on the mounting surface 31 of the submount 30. The submount 30 is an example of a mounting member on which one or more components are mounted. The upper surface of the submount 30 has a rectangular shape. The submount 30 is formed in a rectangular parallelepiped shape.

The upper surface of the submount 30 may have a rectangular shape having short sides and long sides. Here, the long side direction is referred to as a first direction and the short side direction is referred to as a second direction, based on the shape of the mounting surface 31 of the submount 30. In the submount 30 illustrated in the drawings, the first direction is the same direction as the X direction, and the second direction is the same direction as the Y direction.

A plurality of wiring regions 32 are provided on the mounting surface 31. The plurality of wiring regions 32 may include the wiring region 32 provided with a mounting region 33 on which other component(s) is placed. A shape of the mounting region 33 corresponds to a shape of a component to be mounted. The plurality of wiring regions 32 may include the wiring region 32 provided with two or more mounting regions 33.

The submount 30 may include six or more wiring regions 32 on the mounting surface 31. The submount 30 may include, on the mounting surface 31, four or more wiring regions 32 each of which is provided with the mounting region 33. The submount 30 may include, on the mounting surface 31, three or more wiring regions 32 each of which is provided with two or more mounting regions 33. The wiring regions 32 are electrically isolated from each other. Thus, the wiring regions 32 are electrically connected to each other by connecting the wiring regions 32 with a conductive material.

Note that, as illustrated in the drawings, the submount 30 can include seven or more wiring regions 32. Further, the number of the wiring region 32 provided on the mounting surface 31 of the submount 30 is 10 or less.

When the mounting surface 31 is imaginarily divided into five equal parts in the first direction and is divided into five regions, each of the regions at both ends is provided with one or more mounting regions 33. Note that the five regions acquired by dividing the mounting surface 31 into five equal parts in the first direction are five regions divided with four imaginary lines that pass through each of four points dividing a width of the mounting surface 31 in the first direction into five equal parts and are parallel to the second direction. The regions at both ends are distinguished such that the region at one end is referred to as a first region and the region at the other end is referred to as a second region.

One or more mounting regions 33 provided in the first region includes the mounting region 33 having a shape longer in the second direction than in the first direction. One or more mounting regions 33 provided in the second region includes the mounting region 33 having a shape longer in the second direction than in the first direction.

With regard to the regions on both ends when the mounting surface 31 is imaginarily divided into four equal parts in the second direction and divided into four regions, in the top view, a maximum number of the wiring regions 32 through which an imaginary straight line being parallel to the first direction and passing through one of the regions (hereinafter referred to as a third region) passes is lower than a maximum number of the wiring regions 32 through which an imaginary straight line being parallel to the first direction and passing through the other region (hereinafter referred to as a fourth region) passes. The number of the mounting regions 33 provided in the third region is greater than the number of the mounting regions 33 provided in the fourth region.

With regard to all of the mounting regions 33 on the mounting surface 31, in the top view, an imaginary line passing through a middle point of a width of the mounting region 33 in the first direction and being parallel to the second direction does not pass through the other mounting region 33. In other words, two mounting regions 33 are not provided on this imaginary line. Further, the plurality of wiring regions 32 are provided on this imaginary line with regard to the one or the plurality of mounting regions 33. By providing the wiring region 32 and the mounting region 33 in such a manner, the plurality of wiring regions 32 and mounting regions 33 can be efficiently provided while saving space.

The submount 30 may be formed using, for example, silicon nitride, aluminum nitride, or silicon carbide as a main material. The wiring region 32 is formed of a conductive material. The mounting region 33 is formed of a conductive material. The wiring region 32 and the mounting region 33 can be formed by providing, for example, a metal film. Examples of the metal film forming the wiring region 32 include Ti/Pt/Au, and examples of the metal film forming the mounting region 33 include AuSn.

Protective Element 40

The protective element 40 prevents breakage of a specific element (the light-emitting element 20, for example) as a result of an excessive current flowing through the element. The protective element 40 is a Zener diode, for example. Further, as the Zener diode, a Zener diode formed from Si can be employed. A shape of the protective element 40 is substantially square in the top view. Note that the shape of the protective element 40 may not be limited to this.

Temperature Measuring Element 50

The temperature measuring element 50 is an element utilized as a temperature sensor for measuring the ambient temperature. For example, a thermistor can be used as the temperature measuring element 50. A shape of the temperature measuring element 50 is substantially square in the top view. Note that the shape of the temperature measuring element 50 may not be limited to this.

Wiring Line 60

The wiring line 60 is formed of a conductor having a linear shape with bonding portions at both ends. In other words, the wiring line 60 includes bonding portions bonded to other components, at both ends of the linear portion. The wiring line 60 is used for electrical connection between two components. For example, a metal wire can be used as the wiring line 60. Examples of the metal include gold, aluminum, silver, copper, or the like.

Cap 70

The cap 70 includes an upper portion 71 and a lateral wall portion 72. The upper portion 71 includes an upper surface and a lower surface. The lateral wall portion 72 includes one or a plurality of inner surfaces and one or a plurality of outer surfaces. The lateral wall portion 72 has a frame-like shape. The cap 70 includes a recessed surface 73.

A part of an outer edge of the recessed surface 73 intersects a part of an outer edge of the upper surface of the upper portion 71. Another part of the outer edge of the recessed surface 73 constitutes a part of the outer edge of the cap 70 in the top view. Another part of the outer edge of the upper surface of the upper portion 71 constitutes a part of the outer edge of the cap 70 in the top view. The recessed surface 73 is formed along one side of the outer edge of the upper surface of the upper portion 71.

In the top view, an outer shape of the cap 70 is rectangular. In the top view, an outer shape of the upper surface of the upper portion 71 is a rectangular shape having long sides and short sides. The recessed surface 73 is connected to the outer surface of the lateral wall portion 72 and the upper surface of the upper portion 71. The recessed surface 73 is located outside a frame defined by the one or the plurality of inner surfaces of the lateral wall portion 72 in the top view. The recessed surface 73 is formed along the long side of the upper surface of the upper portion 71.

Light-Emitting Device 1

Subsequently, the light-emitting device 1 including the components described above will be described.

In the light-emitting device 1, the one or the plurality of light-emitting elements 20 are mounted on the submount 30. The one or the plurality of light-emitting elements 20 are mounted on the mounting surface 31 of the submount 30. The one or the plurality of the light-emitting elements 20 are disposed in the mounting region(s) 33 of the mounting surface 31. The one or the plurality of light-emitting elements 20 are each disposed so that the light-emitting surface faces laterally. In the light-emitting device 1 illustrated in the drawings, the mounting surface 31 is parallel to the X direction and the Y direction.

The light-emitting surface of the light-emitting element 20 is disposed near the lateral surface of the submount 30. The light-emitting element 20 is disposed near the lateral surface of the submount 30 to the extent that the main portion of light emitted from the light-emitting element 20 is not applied to the mounting surface 31. The lateral surface of the submount 30 intersects the long side of the mounting surface 31. Of the third region and the fourth region, the lateral surface intersects the long side on the third region side.

The light-emitting device 1 may include the plurality of light-emitting elements 20. Hereinafter, when the plurality of light-emitting elements 20 are individually identified and described, the light-emitting elements 20 are distinguished as a first light-emitting element and a second light-emitting element, or the like. The light-emitting device 1 can include the plurality of light-emitting elements 20 that emit light of colors different from one another.

The light-emitting device 1, illustrated in the drawings, includes a first light-emitting element 20A, a second light-emitting element 20B, and a third light-emitting element 20C. The first light-emitting element 20A, the second light-emitting element 20B, and the third light-emitting element 20C are each disposed on the mounting surface 31.

The first light-emitting element 20A emits first light having a peak wavelength at a first wavelength, the second light-emitting element 20B emits second light having a peak wavelength at a second wavelength different from the first wavelength, and the third light-emitting element 20C emits third light having a peak wavelength at a third wavelength different from the first wavelength and the second wavelength. For example, the first light-emitting element 20A emits red light, the second light-emitting element 20B emits green light, and the third light-emitting element 20C emits blue light.

The plurality of light-emitting elements 20 are disposed side by side so that each light-emitting surface faces the same direction. Note that the term "same direction" used here includes a case in which a rotation shift of the light-emitting surface between adjacent light-emitting elements 20 on a plane parallel to the mounting surface 31 falls in a range within ±5 degrees. In the light-emitting device 1 illustrated in the drawings, a direction (third direction) in which the plurality of light-emitting elements 20 are aligned is the same direction as the X direction.

The light emitted from the light-emitting surface of the light-emitting element 20 includes light traveling in a direction perpendicular to the light-emitting surface. In the light-emitting device 1, the direction perpendicular to the light-emitting surface is parallel to the mounting surface 31. Note that the term "parallel" used here includes a case of a range within ±3 degrees. When the light-emitting element 20 is a semiconductor laser element, the light traveling on the optical axis in the semiconductor laser element may be light traveling in the direction perpendicular to the light-emitting surface.

The light emitted from the light-emitting surface of the light-emitting element 20 includes light traveling in a direction (fourth direction) perpendicular to the third direction in the top view. In the light-emitting device 1, the fourth direction is parallel to the mounting surface 31. Note that the term "parallel" used here includes a case of a range within ±3 degrees.

In the illustrated light-emitting device 1, the direction perpendicular to the light-emitting surface is the same direction as the Y direction. The light-emitting element 20 is the semiconductor laser element, and the optical axis of the light emitted from the semiconductor laser element is the same direction as the Y direction.

On the plane parallel to the mounting surface 31, the mounting surface 31 is smaller in length in the fourth direction than in the third direction. In the light-emitting device 1 illustrated in the drawings, the first light-emitting element 20A, the second light-emitting element 20B, and the third light-emitting element 20C are disposed side by side in this order in the third direction. In other words, it can also be said that the second light-emitting element 20B is disposed between the first light-emitting element 20A and the third light-emitting element 20C.

When the mounting surface 31 is imaginarily divided into (2N−1) equal parts in the first direction and divided into (2N−1) regions with respect to the number N of the light-emitting elements 20 mounted on the mounting surface 31, one or more light-emitting elements 20 are disposed in each region at both ends. With such a positional relationship between the submount 30 and the light-emitting element 20, the size of the submount 30 can be adjusted for a position where the light-emitting element 20 is disposed, and thereby contributing to a reduction in size of the light-emitting device 1.

When the mounting surface 31 is imaginarily divided into (2M−1) equal parts in the long side direction and divided into (2M−1) regions with respect to the number M of the light-emitting elements 20 disposed side by side in the third direction on the mounting surface 31, one or more light-emitting elements 20 are disposed in regions at both ends. The regions at both ends are distinguished such that the region at one end is referred to as a fifth region and the region at the other end is referred to as a sixth region.

For example, when three light-emitting element 20 are disposed side by side in the third direction on the mounting surface 31, a value of (2M−1) is 5. At this time, the first region and the fifth region are the same region. Further, the second region and the sixth region are the same region. In the light-emitting device 1 illustrated in the drawings, the first region and the fifth region are indicated by the hatched region R1, and the second region and the sixth region are indicated by the hatched region R2.

For each of the two short sides of the mounting surface 31, a distance from the short side to the light-emitting element 20 disposed in a position closest to the short side is in a range from 0 μm to 50 μm. The light-emitting element 20 is disposed close to the end of the mounting surface 31 within the range of this distance, and thus a width of the submount 30 is brought closer to a width of the plurality of light-emitting elements 20 disposed side by side. Therefore, the light-emitting device 1 can be manufactured in a small size.

A length in the fourth direction of the light-emitting element 20 disposed in the fifth region is greater than a length in the fourth direction of the light-emitting element 20 disposed in the sixth region. In the light-emitting device 1 illustrated in the drawings, the first light-emitting element 20A disposed in the fifth region has a length in the fourth direction greater than that of the third light-emitting element 20C disposed in the sixth region. One or more wiring regions 32 are provided in the sixth region in addition to the wiring region 32 where the light-emitting element 20 is disposed.

Of the light-emitting elements 20 disposed side by side in the third direction, the light-emitting element 20 having the greatest length in the fourth direction is disposed in the fifth region. The light-emitting element 20 being longest in the fourth direction is disposed in the region at the end.

The plurality of light-emitting elements 20 are disposed side by side at equal intervals in the third direction. Note that an interval between the light-emitting elements 20 is measured based on the center of the light-emitting surface of each of the light-emitting elements 20.

In the light-emitting device 1, the one or the plurality of protective elements 40 are mounted on the submount 30. The one or the plurality of protective elements 40 are mounted on the mounting surface 31. The one or the plurality of protective elements 40 are disposed in the mounting region(s) 33 of the mounting surface 31.

The light-emitting device 1 can include the plurality of protective elements 40. Hereinafter, when the plurality of protective elements 40 are individually identified and described, the protective elements 40 are distinguished as a first protective element and a second protective element, or the like.

The protective element 40 protects the light-emitting element 20 mounted on the mounting surface 31. The light-emitting device 1 can include the same number of the protective elements 40 as the number of the light-emitting elements 20 mounted on the mounting surface 31.

In a plan view viewed along a normal direction of the mounting surface 31, a length of the protective element 40 in the second direction is less than a length of the light-emitting element 20 in the second direction. Note that, in the light-emitting device 1 illustrated in the drawings, the plan view viewed along the normal direction of the mounting surface 31 is equivalent to the top view of the light-emitting device 1.

The light-emitting device 1, illustrated in the drawings, includes a first protective element 40A, a second protective element 40B, and a third protective element 40C disposed on the mounting surface 31. The first protective element 40A is the protective element 40 corresponding to the first light-emitting element 20A, that is, the protective element 40 electrically connecting to the first light-emitting element 20A and protecting the first light-emitting element 20A. The second protective element 40B is the protective element 40 corresponding to the second light-emitting element 20B. The third protective element 40C is the protective element 40 corresponding to the third light-emitting element 20C.

In the plan view viewed along the normal direction of the mounting surface 31, the first protective element 40A is disposed between the first light-emitting element 20A and the second light-emitting element 20B. In the plan view viewed along the normal direction of the mounting surface 31, the second protective element 40B and the third protective element 40C are disposed between the second light-emitting element 20B and the third light-emitting element 20C. In this way, the three protective elements 40 corresponding to the first light-emitting element 20A to the third light-emitting element 20C are disposed between the first light-emitting element 20A and the third light-emitting element 20C, and thus the space of the mounting surface 31 can be effectively used, thereby contributing to a reduction in size of the submount 30.

In the plan view viewed along the normal direction of the mounting surface 31, the first protective element 40A is disposed between the imaginary straight line L1 passing through (flush with) a lateral surface 22A (first lateral surface) on a side opposite to a lateral surface 21A (second lateral surface) of the first light-emitting element 20A facing the second light-emitting element 20B, and the imaginary straight line L4 passing through (flush with) a lateral surface 21B on a side opposite to a lateral surface 22B (first lateral surface) of the second light-emitting element 20B facing the first light-emitting element 20A. Such an arrangement can contribute to a reduction in size of the submount 30.

In the plan view viewed along the normal direction of the mounting surface 31, the second protective element 40B is disposed between the imaginary straight line L3 passing through (flush with) the lateral surface 22B on a side opposite to the lateral surface 21B (second lateral surface) of the second light-emitting element 20B facing the third light-emitting element 20C, and the imaginary straight line L6 passing through (flush with) a lateral surface 21C (second lateral surface) on a side opposite to a lateral surface 22C (first lateral surface) of the third light-emitting element 20C facing the second light-emitting element 20B. In the plan view viewed along the normal direction of the mounting surface 31, the third protective element 40C is disposed between the imaginary straight line L3 and the imaginary straight line L6. Such an arrangement can contribute to a reduction in size of the submount 30.

In the plan view viewed along the normal direction of the mounting surface 31, the first protective element 40A is disposed between the imaginary straight line L2 passing through (flush with) the lateral surface 21A of the first light-emitting element 20A facing the second light-emitting element 20B, and the imaginary straight line L3 passing through (flush with) the lateral surface 22B of the second light-emitting element 20B facing the first light-emitting element 20A. Such an arrangement can contribute to a reduction in size of the submount 30.

In the plan view viewed along the normal direction of the mounting surface 31, the second protective element 40B is disposed between the imaginary straight line L4 passing through (flush with) the lateral surface 21B of the second light-emitting element 20B facing the third light-emitting element 20C, and the imaginary straight line L5 passing through (flush with) the lateral surface 22C of the third light-emitting element 20C facing the second light-emitting element 20B. In the plan view viewed along the normal direction of the mounting surface 31, the third protective element 40C is disposed between the imaginary straight line L4 and the imaginary straight line L5. Such an arrangement can contribute to a reduction in size of the submount 30.

In the light-emitting device 1, the temperature measuring element 50 is mounted on the submount 30. The temperature measuring element 50 is mounted on the mounting surface 31. The temperature measurement element 50 is disposed in the mounting region 33 of the mounting surface 31. In the plan view viewed along the normal direction of the mounting surface 31, the temperature measuring element 50 is disposed between the first light-emitting element 20A and the second light-emitting element 20B.

In the plan view viewed along the normal direction of the mounting surface 31, the temperature measuring element 50 is disposed between the imaginary straight line L1 passing through (flush with) the lateral surface 22A on the side opposite to the lateral surface 21A of the first light-emitting element 20A facing the second light-emitting element 20B, and the imaginary straight line L4 passing through (flush with) the lateral surface 21B on the side opposite to the lateral surface 22B of the second light-emitting element 20B facing the first light-emitting element 20A. Such an arrangement can contribute to a reduction in size of the submount 30.

In the plan view viewed along the normal direction of the mounting surface 31, the temperature measuring element 50 is disposed between the imaginary straight line L2 passing through (flush with) the lateral surface 21A of the first light-emitting element 20A facing the second light-emitting element 20B, and the imaginary straight line L3 passing through (flush with) the lateral surface 22B of the second light-emitting element 20B facing the first light-emitting element 20A.

The mounting region 33 where the temperature measuring element 50 is placed has an area larger than that of the mounting region 33 where the first protective element 40A is placed. The mounting region 33 where the temperature measuring element 50 is placed has an area larger than that of any of the mounting region(s) 33 where the one or the plurality of protective elements 40 are placed.

The first protective element 40A and the temperature measuring element 50 are separated from each other in the second direction. The mounting region 33 where the first protective element 40A is placed and the mounting region 33 where the temperature measuring element 50 is placed are disposed in a position where an imaginary line parallel to the second direction passes in the top view. In this way, a length of the submount 30 in the first direction can be suppressed, and this contributes to a reduction in size of the light-emitting device 1.

A total number of the light-emitting elements 20 and the protective elements 40 disposed in the third region is greater than a total number of the light-emitting elements 20 and the protective elements 40 disposed in the fourth region. The components mounted on the submount 30 are disposed closer to the third region than the fourth region.

In the light-emitting device 1, the wiring line 60 is bonded to the wiring region of the submount 30 and the light-emitting element 20 placed on the submount 30. The wiring line 60 is bonded to the light-emitting element 20 placed on the submount 30 and the protective element 40 placed on the submount 30. The wiring line 60 is bonded to the wiring region of the submount 30 and the temperature measuring element 50 placed on the submount 30.

In the light-emitting device 1, the submount 30 is disposed on the upper surface 11 of the substrate 10. The submount 30 is bonded to the substrate 10 by an adhesive. The submount 30 is disposed in the first mounting region 13 of the substrate 10.

The light-emitting element 20 emits light traveling laterally with respect to the upper surface 11 of the substrate 10. Light traveling from the light-emitting element 20 in the fourth direction travels in a direction away from the wiring pattern 14. The fourth region is closer to the wiring pattern 14 than the third region of the submount 30.

The plurality of wiring lines 60 bonded to the wiring region 32 of the submount 30 in the fourth region are bonded to the wiring patterns 14 different from each other. The number of the wiring patterns 14 provided on the substrate 10 is greater than the number of the components placed on the submount 30. Each component placed on the submount 30 is electrically connected to the wiring pattern 14 with the plurality of wiring lines 60.

With regard to the first direction, a length from the end to the end of the one or the plurality of wiring patterns 14 is in a range from 90% to 110% of a length from the end to the end of the submount 30. By matching the two lengths to the same extent, the light-emitting device 1 can be manufactured in a small size.

In the top view, all of the wiring patterns provided in the first mounting region 13 are provided in only one of regions with, as a boundary, an imaginary straight line passing through a long side that constitutes a part of an outer edge of the mounting surface 31 and is included in the fourth region. All of the wiring patterns include the one or the plurality of wiring patterns 14.

In the plan view viewed along the normal direction of the mounting surface 31, the wiring pattern 14 electrically connected to the temperature measuring element 50 is provided between the wiring pattern 14 electrically connected to the first light-emitting element 20A and the wiring pattern 14 electrically connected to the second light-emitting element 20B.

The plurality of wiring patterns 14 are disposed side by side in an order of the two wiring patterns 14 electrically connected to the first light-emitting element 20A and the first protective element 40A, the two wiring patterns 14 electrically connected to the temperature measuring element 50, the two wiring patterns 14 electrically connected to the second light-emitting element 20B and the second protective element 40B, and the two wiring patterns 14 electrically connected to the third light-emitting element 20C and the third protective element 40C.

In the light-emitting device 1, the cap 70 is mounted on the upper surface 11 of the substrate 10. A lower surface of the cap 70 is bonded to the second mounting region 15 of the substrate 10. For example, a metal film provided on the lower surface of the cap 70 and a metal film provided in the second mounting region 15 can be bonded by solder such as AuSn, and the cap 70 can be bonded to the substrate 10.

The substrate 10 and the cap 70 are bonded together, and thus a space closed inside by the substrate 10 and the cap 70 is defined. The submount 30 is disposed in this interior space. It can be said that the submount 30 is disposed in the interior space of a package 80 formed of the substrate 10 and the cap 70. By forming the package 80 so as to close the substrate 10 with the cap 70, the package that matches the size of the first mounting region 13 can be formed. Note that, for example, the package may be formed by bonding a flat plate-shaped component including an upper portion to a component in which a substrate and lateral wall portions are integrated.

The package 80 includes the lateral wall portion 72, the upper portion 71, and a lower portion, and has an interior space defined by the lateral wall portion, the upper portion, and the lower portion. The submount 30 is disposed in the interior space of the package 80. Further, the one or the plurality of light-emitting elements 20 mounted on the submount 30 are disposed in the interior space of the package 80.

By bonding the cap 70 to the substrate 10 under a predetermined atmosphere, the interior space can be a hermetically sealed space. When the semiconductor laser element is employed as the light-emitting element 20, a deterioration in quality due to dust gathering can be suppressed by hermetically sealing the space in which the semiconductor laser element is disposed.

The light emitted from the one or the plurality of light-emitting elements 20 passes through the lateral wall portion 72 of the package 80 and is emitted from the outer surface. The light emitted from the one or the plurality of light-emitting elements 20 passes through the lateral wall portion 72 of the cap 70. The light emitted from the one or the plurality of light-emitting elements 20 is incident on one inner surface (first inner surface) of the lateral wall portion 72, and is emitted from one outer surface (first outer surface).

In the light-emitting device 1 illustrated in the drawings, the light emitted from the first light-emitting element 20A, the second light-emitting element 20B, and the third light-emitting element 20C is incident on the first inner surface of the lateral wall portion 72, and is emitted from the first outer surface of the lateral wall portion 72.

Note that the light emitted from the one or the plurality of light-emitting elements 20 may be emitted from the upper surface of the upper portion 71 and travel upward instead of being emitted from the outer surface of the package 80 and traveling laterally. For example, a reflecting mirror may be disposed, and the light emitted from the one or the plurality of light-emitting elements 20 may be reflected by the reflecting mirror to travel upward and be emitted from the upper surface of the upper portion 71.

The recessed surface 73 is formed along one side (opposite side) that is one side of the upper surface of the upper portion 71 and is located on a side opposite to one side intersecting the first outer surface. The side is the long side in the rectangular shape of the upper surface. The recessed surface 73 is connected to an outer surface (second outer surface) that is an outer surface of the lateral wall portion 72 and is located on a side opposite to the first outer surface, and to the upper surface of the upper portion 71. By providing the recessed surface 73 on the second outer surface side instead of the first outer surface side, the light-emitting surface can be determined and an orientation of the light-emitting device 1 can be determined based on the recessed surface 73.

Second Embodiment

Figure 9:
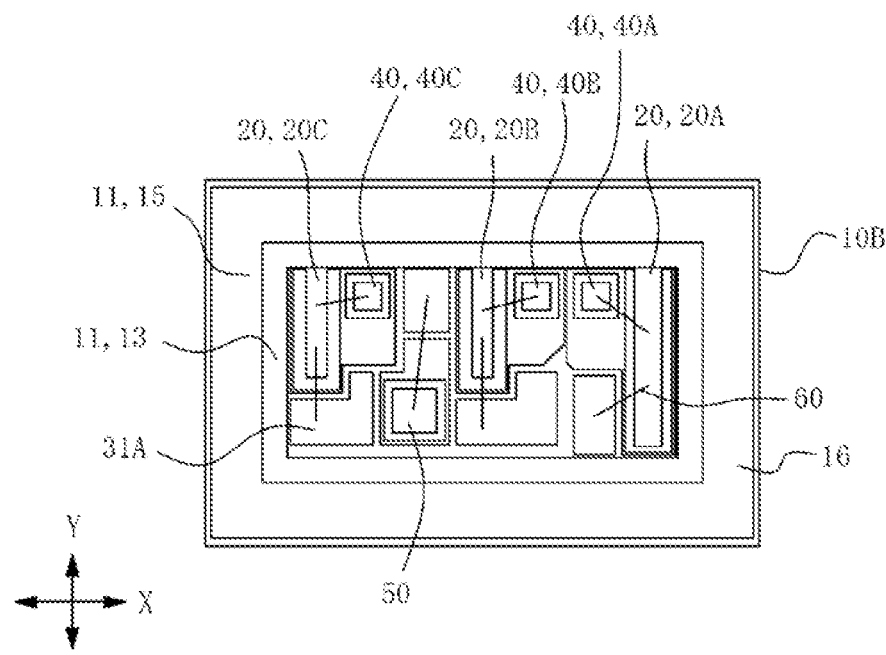
FIG. 9 is a schematic top view of the light-emitting device according to the second embodiment before a cap is mounted.
Figure 10:
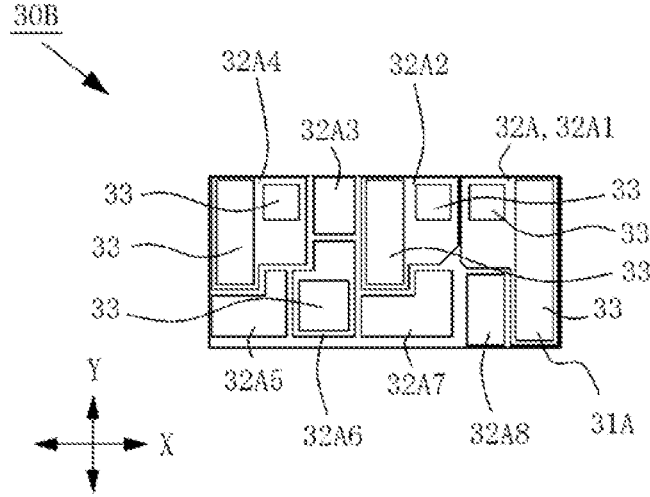
FIG. 10 is a schematic top view of a submount according to the second embodiment.
Figure 11:
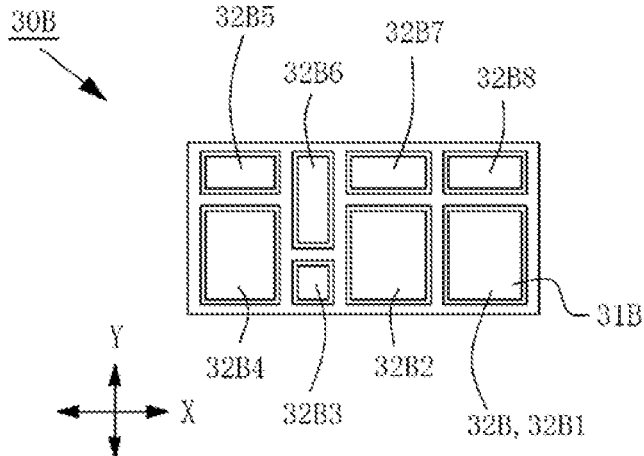
FIG. 11 is a schematic bottom view of the submount according to the second embodiment.

A light-emitting device 2 according to a second embodiment will be described. FIGS. 1 and 9 to 11 are schematic drawings for explaining the light-emitting device 2. FIG. 1 is a schematic perspective view of the light-emitting device 2. FIG. 9 is a schematic top view of the light-emitting device 2 before a cap 70 is mounted. FIG. 10 is a schematic top view of a submount 30B. FIG. 11 is a schematic bottom view of the submount 30B.

The light-emitting device 2 includes a plurality of components. The plurality of components include a substrate 10B, one or a plurality of light-emitting elements 20, the submount 30B, one or a plurality of protective elements 40, a temperature measuring element 50, a wiring line 60, and the cap 70. Note that the light-emitting device 2 may include a component other than the components described above. The light-emitting device 2 may not include some of the plurality of components described above.

In the light-emitting device 2, the light-emitting element 20, the protective element 40, the temperature measuring element 50, the wiring line 60, and the cap 70 are similar to the components in the light-emitting device 1. Therefore, the contents described for the components in the first embodiment apply similarly to the components in the light-emitting device 2.

The substrate 10B and the submount 30B have characteristics different from the substrate 10 and the submount 30 in the first embodiment, but also have common characteristics. Of the contents described for the substrate 10 and the contents described for the submount 30 in the first embodiment, contents that are not inconsistent based on FIGS. 9 to 11 are contents that apply similarly to the substrate 10B and the submount 30B. Hereinafter, the different characteristics of the substrate 10B and the submount 30B will be described.

Substrate 10B

The substrate 10B is different from the substrate 10 in an arrangement and a shape of a wiring pattern 14. In the substrate 10B, a plurality of the wiring patterns 14 are disposed side by side in both directions of the first direction and the second direction.

Submount 30B

The submount 30B includes a mounting surface 31 including a wiring region 32 not only on an upper surface of the submount 30B but also on a lower surface. Here, the mounting surface 31 on the upper surface side is referred to as a first mounting surface 31A and the mounting surface 31 on the lower surface side is referred to as a second mounting surface 31B to distinguish the mounting surfaces on the surface sides. Further, the wiring region 32 provided on the first mounting surface 31A is referred to as a first wiring region 32A and the wiring region 32 provided on the second mounting surface 31B is referred to as a second wiring region 32B to distinguish the wiring regions on the mounting surfaces.

In the submount 30B, a plurality of the first wiring regions 32A and a plurality of the second wiring regions 32B are electrically connected. The first wiring region 32A and the second wiring region 32B are electrically connected to each other via a wiring formed on the submount 30B. In order to facilitate understanding of a conduction relationship between the first wiring region 32A and the second wiring region 32B, in FIGS. 10 and 11, reference signs 32A and 32B are provided with numbers 1 to 8 at the end to indicate each wiring region 32 (first wiring regions 32A1 to 32A8 and second wiring regions 32B1 to 32B8). The first wiring region 32A and the second wiring region 32B having the same number at the end are electrically connected.

A shape of the second wiring region 32B is simpler than a shape of the first wiring region 32A. The second wiring region 32B has a rectangular shape. The number of the first wiring region 32A provided on the first mounting surface 31A and the number of the second wiring region 32B provided on the second mounting surface 31B are equal.

Light-Emitting Device 2

Subsequently, the light-emitting device 2 including the components described above will be described. The light-emitting device 2 also has characteristics different from the light-emitting device 1 in the first embodiment, but also has common characteristics. Of the contents described for the light-emitting device 1 in the first embodiment, contents that are not inconsistent based on FIGS. 1 and 2 and FIGS. 9 to 11 are contents that apply similarly to the light-emitting device 2.

In the light-emitting device 2, the second protective element 40B is disposed between an imaginary straight line L1 and an imaginary straight line L4. The temperature measuring element 50 is disposed between an imaginary straight line L3 and an imaginary straight line L6. Further, in the light-emitting device 2, the second protective element 40B is disposed between an imaginary straight line L2 and the imaginary straight line L3. The temperature measuring element 50 is disposed between the imaginary linear L4 and an imaginary straight line L5.

In the light-emitting device 2, the second wiring region 32B of the submount 30B is bonded to the wiring pattern 14 of the substrate 10. By bonding, the plurality of second wiring regions 32B are electrically connected to wiring patterns 14 different from each other. In the light-emitting device 2, the wiring pattern may not be provided on the upper surface of the substrate 10 outside a region where the submount 30B is placed. In this way, the light-emitting device 2 can be manufactured in a small size.

Third Embodiment

Figure 12:
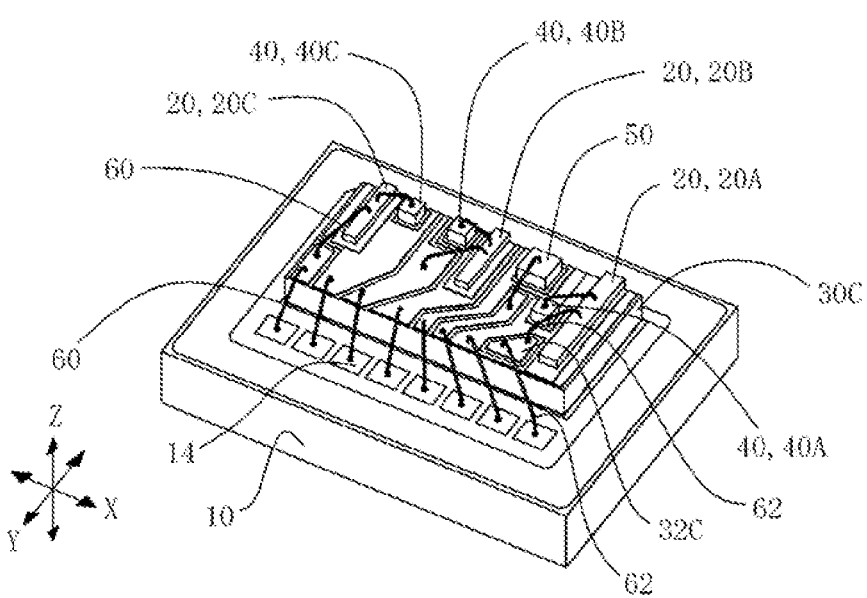
FIG. 12 is a top view of the light-emitting device according to the third embodiment before a cap is mounted.
Figure 13:
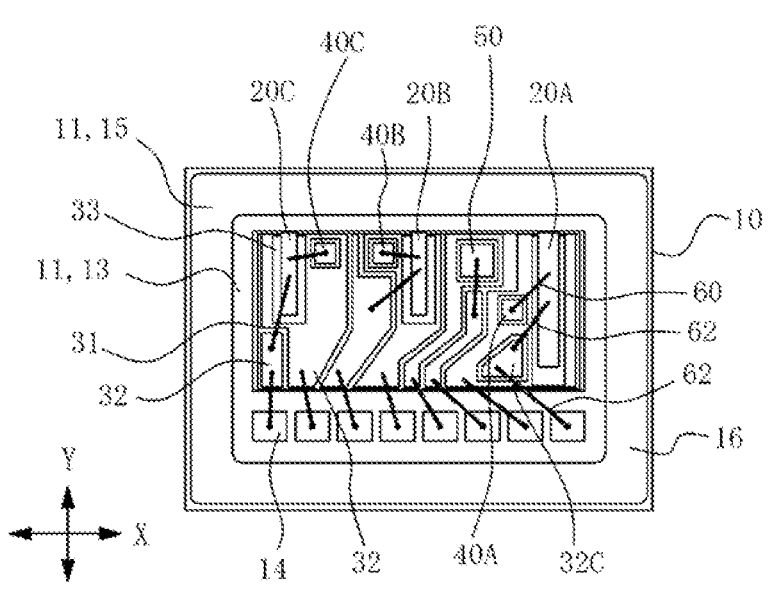
FIG. 13 is a top view of the light-emitting device according to the third embodiment before the cap is mounted.

A light-emitting device 3 according to a third embodiment will be described. FIGS. 1, 2, 6, 12, and 13 are drawings for explaining the light-emitting device 3. FIG. 1 is a schematic perspective view of the light-emitting device 3. FIG. 2 is a schematic cross-sectional view of the light-emitting device 3 taken along the line II-II in FIG. 1. FIG. 6 is a schematic top view of a substrate 10. FIG. 12 is a schematic perspective view of the light-emitting device 3 before a cap 70 is mounted. FIG. 13 is a schematic top view of the light-emitting device 3 before the cap 70 is mounted.

The light-emitting device 3 includes a plurality of components. The plurality of components include the substrate 10, one or a plurality of light-emitting elements 20, a submount 30C, one or a plurality of protective elements 40, a temperature measuring element 50, a wiring line 60 (hereinafter referred to as a first wiring line 60), a second wiring line 62, and the cap 70. Note that the light-emitting device 3 may include a component other than the components described above. The light-emitting device 3 may not include some of the plurality of components described above.

In the light-emitting device 3, the substrate 10, the light-emitting element 20, the protective element 40, the temperature measuring element 50, the wiring line 60, and the cap 70 are similar to the components in the light-emitting device 1. Therefore, the contents described for the components in the first embodiment apply similarly to the components in the light-emitting device 3. The same wiring line as the wiring line 60 can be used as the second wiring line 62.

The submount 30C has characteristics different from the submount 30 in the first embodiment, but also has common characteristics. Of the contents described for the submount 30 in the first embodiment, contents that are not inconsistent based on FIGS. 12 and 13 are contents that apply similarly to the submount 30C. Hereinafter, the different characteristics of the submount 30C will be described.

Submount 30C

The submount 30C includes a wiring region 32 that is not included in the submount 30 in the first embodiment. This wiring region 32 is referred to as a third wiring region 32C for convenience.

The third wiring region 32C is provided in a region adjacent to the first region. The third wiring region 32C is provided in the first region. The third wiring region 32C is provided from the first region to the region adjacent to the first region. Note that the third wiring region 32C may be provided in the first region and not in the region adjacent to the first region.

The third wiring region 32C is provided in the fourth region. The third wiring region 32C is provided near an outer edge of the submount 30C on the fourth region side. A mounting region 33 is not provided in the third wiring region 32C.

Light-Emitting Device 3

Subsequently, the light-emitting device 3 including the components described above will be described. The light-emitting device 3 also has characteristics different from the light-emitting device 1 in the first embodiment, but also has common characteristics. Of the contents described for the light-emitting device 1 in the first embodiment, contents that are not inconsistent based on FIGS. 1, 2, 6, 12, and 13 are contents that apply similarly to the light-emitting device 3.

A distance from a lateral surface on a side opposite to the light-emitting surface of the light-emitting element 20 disposed in the fifth region to a long side of the mounting surface 31 on the fourth region side is in a range from 0 μm to 50 μm. In this way, the submount 30C can be manufactured in a small size in the second direction. Note that a fact that the distance is 0 μm includes not only a case in which the lateral surface on the side opposite to the light-emitting surface of the light-emitting element 20 overlaps the long side of the mounting surface 31 on the fourth region side in the plan view viewed along the normal direction of the mounting surface 31, but also a case in which the lateral surface on the side opposite to the light-emitting surface of the light-emitting element 20 is located outside the mounting surface 31, that is, a case in which the lateral surface on the side opposite to the light-emitting surface of the light-emitting element 20 protrudes from the mounting surface 31.

A distance from a lateral surface on aside opposite to the light-emitting surface of the light-emitting element 20 disposed in the sixth region to the long side of the mounting surface 31 on the fourth region side is in a range from 200 μm to 800 μm. In the plan view viewed along the normal direction of the mounting surface 31, in the sixth region, the wiring region 32 different from the wiring region 32 provided with the mounting region 33 where the light-emitting element 20 is disposed is disposed between the mounting region 33 and the long side of the mounting surface 31 on the fourth region side. In this way, by using a difference in shape of the mounting region 33 where the light-emitting element 20 is disposed in each of the fifth region and the sixth region, a space for providing the wiring region 32 can be effectively created, and a reduction in size of the submount 30 can be achieved.

The third wiring region 32C is provided in a position closer to the long side on the fourth region side than the mounting region 33 where the protective element 40 protecting the light-emitting element 20 disposed in the fifth region is placed.

A bonding portion at another end of the second wiring line 62 is bonded to the third wiring region 32C while a bonding portion at one end of the second wiring line 62 is bonded to the light-emitting element 20 disposed in the fifth region. A bonding portion at another end of the second wiring line 62 is bonded to the third wiring region 32C while a bonding portion at one end of the second wiring line 62 is bonded to the wiring pattern 14. Of these two wiring lines 60 bonded to the third wiring region 32C, the latter wiring line 60 is bonded to the third wiring region 32C in a position closer to the long side on the fourth region side than the former wiring line 60.

In the light-emitting device 1, a bonding portion at another end of the wiring line 60 is bonded to the wiring pattern 14 while a bonding portion at one end of the wiring line 60 is bonded to the light-emitting element 20 disposed in the fifth region. On the other hand, in the light-emitting device 3, the wiring line 60 passes through the third wiring region 32C instead of being provided to directly connect the light-emitting element 20 and the wiring pattern 14. In this way, the number of the wiring line 60 to be used increases, but a length of each wiring line 60 can be shorter than the wiring line 60 that makes direct connection, and a maximum height of the wiring line 60 from the upper surface of the substrate 10 can be reduced. Thus, the light-emitting device 3 can be manufactured in a small size.

In the plan view viewed along the normal direction of the mounting surface 31, all of the wiring lines 60 that satisfy a condition that a bonding portion at one end is bonded to any of the wiring patterns 14 and is electrically connected to any of the light-emitting elements 20 disposed on the submount 30C are disposed so as to fall within the fourth region of the submount 30C. The wiring lines 60 fall within the fourth region, and thus a maximum height of the wiring lines 60 can be reduced, and the light-emitting device 3 can be manufactured in a small size.

In the plan view viewed along the normal direction of the mounting surface 31, a bonding portion at another end of each of the wiring lines 60 including a bonding portion at one end bonded to each of all of the wiring patterns 14 is disposed so as to fall within the fourth region of the submount 30C. The wiring lines 60 fall within the fourth region, and thus a maximum height of the wiring lines 60 can be reduced, and the light-emitting device 3 can be manufactured in a small size.

In the plan view viewed along the normal direction of the mounting surface 31, the third wiring region 32C is disposed between an imaginary straight line L2 and an imaginary straight line L3. The third wiring region 32C is provided in a position closer to the sixth region than the mounting region 33 where the light-emitting element 20 is disposed in the fifth region.

In the plan view viewed along the normal direction of the mounting surface 31, the third wiring region 32C is not provided in a position where an imaginary straight line L1 passes. In the plan view viewed along the normal direction of the mounting surface 31, the third wiring region 32C is not provided in a position where the imaginary straight line L2 passes. In the plan view viewed along the normal direction of the mounting surface 31, the third wiring region 32C is not provided in a position where the imaginary straight line L3 passes. By providing the third wiring region 32C in such a position, the submount 30C can be manufactured in a small size in the second direction.

Although each of the embodiments according to the present invention has been described above, the light-emitting device according to the present invention is not strictly limited to the light-emitting device in each of the embodiments. In other words, the present invention can be achieved without being limited to an outer shape or a structure of the light-emitting device disclosed by each of the embodiments. The present invention may be applied without requiring all the components being sufficiently provided. For example, in a case in which some of the components of the light-emitting device disclosed by the embodiments are not stated in the scope of the claims, the degree of freedom in design by those skilled in the art such as substitutions, omissions, shape modifications, and material changes for those components is allowed, and then the invention stated in the scope of the claims being applied to those components is specified.

Throughout the contents described in this specification, the following aspects of technical matters are disclosed.

(Aspect 1)

A light-emitting device including: a mounting member, a first light-emitting element, a second light-emitting element, a third light-emitting element, a first protective element, a second protective element and a third protective element. The mounting member has a mounting surface. The first light-emitting element is disposed on the mounting surface. The second light-emitting element is disposed on the mounting surface. The third light-emitting element is disposed on the mounting surface. The first protective element is disposed on the mounting surface and electrically connected to the first light-emitting element. The second protective element is disposed on the mounting surface and electrically connected to the second light-emitting element. The third protective element is disposed on the mounting surface and electrically connected to the third light-emitting element. In a plan view viewed along a normal direction of the mounting surface, at least a part of the first protective element is disposed between the first light-emitting element and the second light-emitting element, at least a part of the second protective element and at least a part of the third protective element are disposed between the second light-emitting element and the third light-emitting element, and the second light-emitting element is disposed between the first light-emitting element and the third light-emitting element.

(Aspect 2)

The light-emitting device according to Aspect 1, wherein, in the plan view, the first protective element is disposed between an imaginary straight line flush with a first lateral surface of the first light-emitting element on a side opposite to a second lateral surface of the first light-emitting element facing the second light-emitting element, and an imaginary straight line flush with a second lateral surface of the second light-emitting element on a side opposite to a first lateral surface of the second light-emitting element facing the first light-emitting element, and in the plan view, the second protective element and the third protective element are disposed between an imaginary straight line flush with the first lateral surface of the second light-emitting element, and an imaginary straight line flush with a second lateral surface of the third light-emitting element on a side opposite to a first lateral surface of the third light-emitting element facing the second lateral surface of the second light-emitting element.

(Aspect 3)

The light-emitting device according to Aspect 1, wherein, in the plan view, the first protective element is disposed between an imaginary straight line flush with a lateral surface of the first light-emitting element facing the second light-emitting element, and an imaginary straight line flush with a lateral surface of the second light-emitting element facing the first light-emitting element, and in the plan view, the second protective element and the third protective element are disposed between an imaginary straight line flush with a lateral surface of the second light-emitting element facing the third light-emitting element, and an imaginary straight line flush with a lateral surface of the third light-emitting element facing the second light-emitting element.

(Aspect 4)

The light-emitting device according to Aspect 2 or 3, further including a temperature measuring element disposed on the mounting surface, wherein in the plan view, the temperature measuring element is disposed between the imaginary straight line flush with the first lateral surface of the first light-emitting element and the imaginary straight line flush with the second lateral surface of the second light-emitting element.

(Aspect)

The light-emitting device according to any one of Aspects 1 to 4, further including a package including a lateral wall portion, an upper portion, and a lower portion defining an interior space, wherein the mounting member is disposed in the interior space of the package, and a light emitted from the first light-emitting element, a light emitted from the second light-emitting element, and a light emitted from the third light-emitting element are incident on a first inner surface of the lateral wall portion of the package, and are emitted from a first outer surface of the lateral wall portion.

(Aspect 6)

The light-emitting device according to Aspect 5, wherein the package has a recessed surface connected to a second outer surface located on a side opposite to the first outer surface, and to an upper surface of the upper portion.

The light-emitting device according to each of the embodiments described above can be used for a head-mounted device, a head-mounted display, a projector, an on-vehicle headlight, lighting, a display, and the like.

What is claimed is:

1. A light-emitting device comprising:
a mounting member having a mounting surface and a lateral surface facing a first direction parallel to the mounting surface;
a first light-emitting element disposed on the mounting surface adjacent to the lateral surface of the mounting member, the first light-emitting element being a semiconductor laser element having a first light-emitting surface configured to emit light in the first direction;

a second light-emitting element disposed on the mounting surface adjacent to the lateral surface of the mounting member, the second light-emitting element being a semiconductor laser element having a second light-emitting surface configured to emit light in the first direction;

a third light-emitting element disposed on the mounting surface adjacent to the lateral surface of the mounting member, the third light-emitting element being a semiconductor laser element having a third light-emitting surface configured to emit light in the first direction;

a first protective element disposed on the mounting surface and electrically connected to the first light-emitting element;

a second protective element disposed on the mounting surface and electrically connected to the second light-emitting element; and a third protective element disposed on the mounting surface and electrically connected to the third light-emitting element, wherein a length of the first light-emitting element in the first direction is greater than a length of the third light-emitting element in the first direction, and in a plan view viewed along a normal direction of the mounting surface, at least a part of the first protective element is disposed between the first light-emitting element and the second light-emitting element, at least a part of the second protective element and at least a part of the third protective element are disposed between the second light-emitting element and the third light-emitting element, and the second light-emitting element is disposed between the first light-emitting element and the third light-emitting element.

2. The light-emitting device according to claim 1, wherein in the plan view, the first protective element is disposed between an imaginary straight line flush with a first lateral surface of the first light-emitting element on a side opposite to a second lateral surface of the first light-emitting element facing the second light-emitting element, and an imaginary straight line flush with a second lateral surface of the second light-emitting element on a side opposite to a first lateral surface of the second light-emitting element facing the first light-emitting element, and in the plan view, the second protective element and the third protective element are disposed between an imaginary straight line flush with the first lateral surface of the second light-emitting element, and an imaginary straight line flush with a second lateral surface of the third light-emitting element on a side opposite to a first lateral surface of the third light-emitting element facing the second lateral surface of the second light-emitting element.

3. The light-emitting device according to claim 1, wherein in the plan view, the first protective element is disposed between an imaginary straight line flush with a lateral surface of the first light-emitting element facing the second light-emitting element, and an imaginary straight line flush with a lateral surface of the second light-emitting element facing the first light-emitting element, and in the plan view, the second protective element and the third protective element are disposed between an imaginary straight line flush with a lateral surface of the second light-emitting element facing the third light-emitting element, and an imaginary straight line flush with a lateral surface of the third light-emitting element facing the second light-emitting element.

4. The light-emitting device according to claim 2, further comprising a temperature measuring element disposed on the mounting surface, wherein in the plan view, the temperature measuring element is disposed between the imaginary straight line flush with the first lateral surface of the first light-emitting element and the imaginary straight line flush with the second lateral surface of the second light-emitting element.

5. The light-emitting device according to claim 1, further comprising a package including a lateral wall portion, an upper portion, and a lower portion defining an interior space, wherein the mounting member is disposed in the interior space of the package, and the light emitted from the first light-emitting element, the light emitted from the second light-emitting element, and the light emitted from the third light-emitting element are incident on a first inner surface of the lateral wall portion of the package, and are emitted from a first outer surface of the lateral wall portion.

6. The light-emitting device according to claim 5, wherein the package has a recessed surface connected to a second outer surface located on a side opposite to the first outer surface, and to an upper surface of the upper portion.

7. The light-emitting device according to claim 3, further comprising a temperature measuring element disposed on the mounting surface, wherein in the plan view, the temperature measuring element is disposed between the imaginary straight line flush with the lateral surface of the first light-emitting element and the imaginary straight line flush with the lateral surface of the second light-emitting element.

8. The light-emitting device according to claim 2, further comprising a package including a lateral wall portion, an upper portion, and a lower portion defining an interior space, wherein the mounting member is disposed in the interior space of the package, and the light emitted from the first light-emitting element, the light emitted from the second light-emitting element, and the light emitted from the third light-emitting element are incident on a first inner surface of the lateral wall portion of the package, and are emitted from a first outer surface of the lateral wall portion.

9. The light-emitting device according to claim 8, wherein the package has a recessed surface connected to a second outer surface located on a side opposite to the first outer surface, and to an upper surface of the upper portion.

10. The light-emitting device according to claim 1, wherein the first light-emitting element, the second light-emitting element, and the third light-emitting element are aligned along a second direction perpendicular to the first direction, and the first light-emitting element, the second light-emitting element, and the third light-emitting element are disposed at equal intervals as measured based on centers of the first light-emitting surface, the second light-emitting surface, and the third light-emitting surface.

11. The light-emitting device according to claim 4, wherein the first light-emitting element, the second light-emitting element, and the third light-emitting element are aligned along a second direction perpendicular to the first direction, and a length of the temperature measuring element in the second direction is greater than a length of the second protective element in the second direction, the second protective element and the third protective element are aligned along the second direction, and the first protective element and the temperature measuring element at least partially overlap each other when viewed along the first direction.

12. The light-emitting device according to claim 10, wherein a length of the temperature measuring element in the second direction is greater than a length of the second protective element in the second direction, the second protective element and the third protective element are aligned along the second direction, and the first protective element and the temperature measuring element at least partially overlap each other when viewed along the first direction.

13. The light-emitting device according to claim 1, wherein the first light-emitting element is configured to emit first light having a peak wavelength at a first wavelength, the second light-emitting element is configured to emit second light having a peak wavelength at a second wavelength different from the first wavelength, and the third light-emitting element is configured to emit third light having a peak wavelength at a third wavelength different from the first wavelength and the second wavelength.

14. The light-emitting device according to claim 1, wherein the first light-emitting element is configured to emit red light, the second light-emitting element is configured to emit green light, and the third light-emitting element is configured to emit blue light.

15. The light-emitting device according to claim 1, wherein a distance from a lateral surface of the first light-emitting element on a side opposite to the first light-emitting surface to a lateral surface of the mounting surface facing the same direction as the lateral surface of the first light-emitting element is in a range from 0 μm to 50 μm, and a distance from a lateral surface of the third light-emitting element on a side opposite to the third light-emitting surface to a lateral surface of the mounting surface facing the same direction as the lateral surface of the third light-emitting element is in a range from 200 μm to 800 μm.

* * * * *